US008238104B2

(12) United States Patent  
Salpeter

(10) Patent No.: US 8,238,104 B2  
(45) Date of Patent: Aug. 7, 2012

(54) DATA CENTER WITH FIN MODULES

(75) Inventor: Isaac A. Salpeter, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 177 days.

(21) Appl. No.: 12/853,190

(22) Filed: Aug. 9, 2010

(65) Prior Publication Data

US 2012/0031585 A1    Feb. 9, 2012

(51) Int. Cl.  
*H05K 7/20*    (2006.01)

(52) U.S. Cl. ........ 361/716; 361/690; 361/695; 361/721; 361/730; 165/80.3; 165/104.33; 454/184

(58) Field of Classification Search .................... None  
See application file for complete search history.

(56) References Cited

U.S. PATENT DOCUMENTS

| | | | |
|---|---|---|---|
| 5,822,551 A | 10/1998 | Crane, Jr. et al. | |
| 6,052,276 A | 4/2000 | Do et al. | |
| 7,573,715 B2 * | 8/2009 | Mojaver et al. | 361/716 |
| 7,854,652 B2 * | 12/2010 | Yates et al. | 454/184 |
| 7,856,838 B2 * | 12/2010 | Hillis et al. | 62/259.2 |
| 7,971,446 B2 * | 7/2011 | Clidaras et al. | 62/259.2 |
| 8,031,468 B2 * | 10/2011 | Bean et al. | 361/696 |
| 2005/0257654 A1 | 11/2005 | Huang | |
| 2008/0244052 A1 | 10/2008 | Bradicich et al. | |
| 2009/0284931 A1 * | 11/2009 | Babock et al. | 361/716 |

OTHER PUBLICATIONS

International Search Report from PCT/US2011/046918, mailed Oct. 27, 2011, Amazon Technologies, Inc., all pages.

* cited by examiner

*Primary Examiner* — Boris Chervinsky  
(74) *Attorney, Agent, or Firm* — Robert C. Kowert; Meyertons, Hood, Kivlin, Kowert & Goetzel, P.C.

(57) ABSTRACT

A system for providing computing capacity includes a base module and two or more fin modules coupled to the base module. At least one of the fin modules includes one or more fins and two or more computer systems coupled to the fins. At least one of the fins to which the computer systems are coupled extends from the base module such that the fin has a primarily vertical orientation. An electrical power bus in the base module supplies power to computer systems of the fin modules. The site of operation may be indoors, out of doors, or in a limited shelter.

28 Claims, 8 Drawing Sheets

DATA CENTER WITH FIN MODULES

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data center includes numerous rack-mounted servers housed in a building, which provides protection operating equipment. Such buildings may require a substantial investment in the form of construction costs, maintenance costs, and/or leasing costs. In addition, substantial time and resources are typically required to design and build a data center (or expansion thereof), lay cables, install racks and cooling systems. Additional time and resources are typically needed to conduct inspections and obtain certifications and approvals, such as for electrical and HVAC systems.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect.

Troubleshooting, repairing or replacing the servers in a data center on a server-by-server basis may be labor intensive and expensive. In some cases, a data center may have multiple server types and multiple rack types, some of which may have different power requirements, cooling arrangements, and network topologies, etc., which may result in lower utilization of data center space.

Many data centers rely on forced air systems and air conditioning to maintain the temperatures and other environmental conditions in the data center within acceptable limits. The initial and ongoing costs of installing and operating these systems may add substantial cost and complexity to data center operations.

Figure 1:
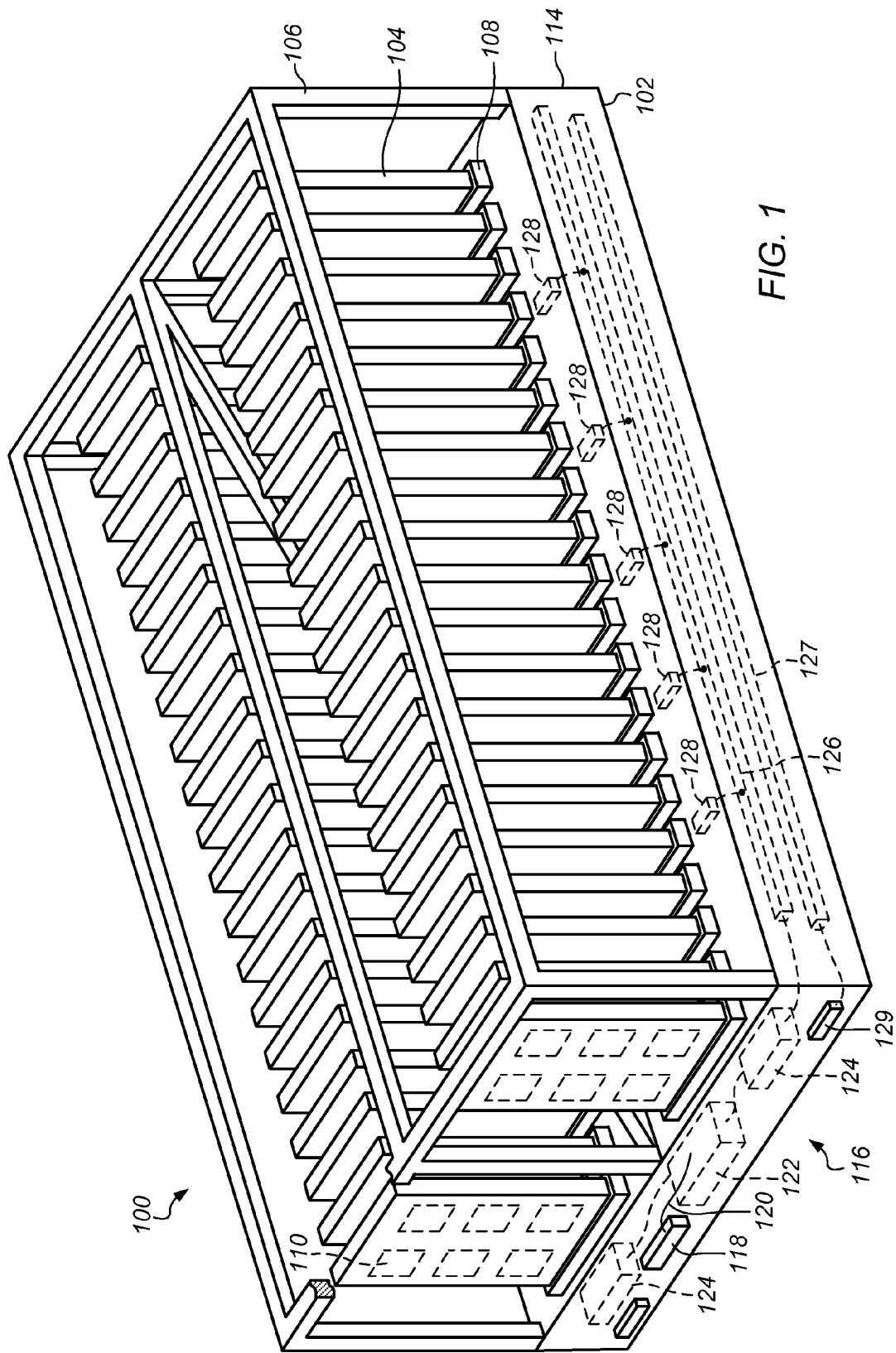
FIG. 1 illustrates one embodiment of a data center including fin modules on a base module.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

According to one embodiment, a system for providing computing capacity includes a base module and two or more fin modules coupled to the base module. At least one of the fin modules includes one or more fins and two or more computer systems coupled to the fins. At least one of the fins to which the computer systems are coupled extends from the base module such that the fin has a primarily vertical orientation. An electrical power bus in the base module supplies power to computer systems of the fin modules. In various embodiments, the site of operation for the system may be indoors, out of doors, or in a limited shelter.

According to one embodiment, a system for providing computing capacity includes a base module and two or more fin modules coupled to the base module. The fin modules may be field replaceable units. At least one of the fin modules includes one or more fins and two or more computer systems coupled to the fins. At least one of the fins to which the computer systems are coupled extends from the base module such that the fin has a primarily vertical orientation.

According to one embodiment, a method of providing computing capacity includes installing two or more fin modules on a base module to form a unit. The fin modules extend from the base module such that the fin modules have a primarily vertical orientation. The unit, with the fin modules installed on the base module, is transported to a data center and placed at a location at a data center. The computer systems are operated to perform computing operations at the data center.

According to one embodiment, a system for providing computing capacity includes a base module and two or more fin modules coupled to the base module. At least one of the fin modules includes one or more fins and two or more computer systems coupled to the fins. The fins form an enclosure for the computer systems to protect the at least one computer system from environmental conditions. The system is configured to operate in an outdoor environment.

According to one embodiment, a system for providing computing capacity includes a base module and two or more fin modules coupled to the base module. At least one of the fin modules includes one or more fins and two or more computer systems coupled to the fins. The fins form an enclosure for the computer systems to protect the at least one computer system from environmental conditions. The fin modules may be field replaceable units.

According to one embodiment, a method of providing computing capacity includes installing one or more fin modules on a base module to form a unit. The fin modules protect computer systems in the fin modules such that the computer systems can be operated in an outdoor environment. The computer systems are operated to perform computing operations with the unit in an outdoor location.

As used herein, an "aisle" means a space next to one or more racks.

As used herein, "ambient" refers to a condition of outside air at the location of a system or data center. An ambient temperature may be taken, for example, at or near an intake hood of an air handling system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "field replaceable unit" of a system means a unit that can be removed from the system while the system is in the field, such as at a data center or other location where the system is in operation.

As used herein, "fin" means a structural element, or combination of structural elements, that can extend from a supporting base. A fin may have any shape or construction, including a plate, and sheet, a frame, a channel, or a combination thereof. In some embodiments, a fin may be a combination of structural elements, such as left and right sides of a "clam-shell". In some embodiments, a fin extends in a direction perpendicular to a plane of the base element to which it is mounted. A fin may, however, extend at any angle relative to a base element. A fin may be in a vertical plane when installed or in a non-vertical plane. In certain embodiments, a fin may be supported on more than one of its ends in a fully installed condition. For example, a fin may be supported on a base at a bottom end of the fin and be supported by a rail at the top end of the fin. In some embodiments, a fin may conduct heat away from heat-producing components mounted to the fin.

As used herein, "fin module" means a module that includes one or more fins. A fin module may include additional components, such as circuit board assemblies, servers, hard disk drives, heat sinks, power supplies, connectors, cables, and gaskets.

As used herein, "heat spreading", as applied to an element, a portion of an element, or a combination of elements, means that the element(s) or portion of the element can spread heat or transfer heat away from a heat producing component. One heat spreading portion of an element may overlap with other heat spreading portions of the element.

As used herein, a "module" is a component or a combination of components physically coupled to one another. A module may include functional elements and systems, such as computer systems, servers, hard disk drives, power supplies, fans, and control systems, as well as structural elements, such a frame, housing, or container. In some embodiments, a module is pre-fabricated at a location off-site from a data center.

As used herein, "power distribution unit" refers to any device, module, component, or a combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, a "space" means a space, area or volume.

As used herein, with respect to the orientation of an element, "primarily vertical" means that the element is oriented more vertical than horizontal.

In some embodiments, computer systems, such as servers for a data center, are provided on fin modules on a common base module. The fin modules may provide environmental protection and a stable operating environment for the computer systems. In some embodiments, a system including fin modules is located outside of a building. FIG. 1 illustrates one embodiment of a data center including fin modules on a base module. System 100 includes base module 102, fin modules 104, and frame 106. Frame 106 may be an open box frame. Fin modules 104 couple to base module 102 in receptacles 108. Each of fin modules 104 includes computer systems 110.

In some embodiments, the form of system 100 is in accordance with a standard unit for containerized shipping. In one embodiment, system 100 has dimensions and attach points in accordance with a Twenty Foot Equivalent Unit ("TEU") standard. In one embodiment, base module 102 of system 100 may be the entire width and length of a standard TEU.

System 100 may be suitable for shipping as a unit. Tarpaulins, panels, or other covers may be provided to secure or seal the unit for shipment. In some embodiments, covers provided for shipping of a computing unit are removed before the computing unit is placed into service. In some embodiments, system 100 is designed to survive at least a one-way trans-oceanic shipment plus intermodal truck/rail journey from point of manufacture/assembly to its destination. System 100 may be designed to withstand at least one more truck/rail journey to a maintenance/remanufacturing depot.

Base module 102 includes chassis 114, power distribution system 116, and data bus 118. Each of receptacles 108 on chassis 114 of base module 102 may receive one of fin modules 104.

Power distribution system 116 may distribute power to electrical power to computer systems 110 and other electrical components in fin modules 104. Power distribution system 116 includes power interface panel 118, base module input power lines 120, uninterruptible power supply 122, power distribution units 124, power buses 126, and power supplies 128. Base module input power lines 120 may couple with power lines external to system 100 at power interface panel 118. Base module input power lines 120 may supply power to power bus 126 through uninterruptible power supply 122 and power distribution units 124. Power supplies 128 may receive power from power bus 126 and supply power to electrical loads in fin modules 104, such as computer systems 110. In some embodiments, power supplies have a DC power output, for example, in accordance with an ATX standard. In some embodiments, power distribution system 116 includes circuit breakers (for example, in power distribution units 124). The connectors may be environmentally sealed. In some embodiments, system 100 is certified as a unit (for example, UL-certified). In some embodiments, individual modules (such as fin modules 102 or base module 104) are certified as a unit (for example, UL-certified).

Although only one UPS is shown in FIG. 1, a system may in some embodiments have more than UPS (for example, two UPSs). In certain embodiments, a base module may have no UPS. In addition, a system may include any number of power distribution units, power buses, and power supplies. In some embodiments, various elements of power distribution system, such as UPSs, power distribution units, and power supplies, may be located outside of a base module. In certain embodiments, electrical power may be routed from an external source into one or more fin modules through connectors mounted in the enclosure for the fin module. In some embodiments, electrical power and/or data may pass directly into fin modules without being routed through the base module.

In some embodiments, system 100 can accept a range of input voltages and currents. In one embodiment, system 100 is supplied with 480V power. In certain embodiments, power is supplied to fin modules 104 via an overhead drop and connector. System 100 may include a transformer that transforms input power from one voltage level to another level.

In certain embodiments, a base module may include multiple independent power and/or network buses and/or power distribution systems. For example, each row of fin modules may have its own independent power distribution system and its own network bus. In some embodiments, chassis 114 forms a sealed enclosure for functional elements of base module 102, such as power bus 126. In various embodiments, base module 102 is suitable for operation in an outdoor environment.

Data bus 127 may couple with external data lines at data interface panel 129. Data bus may transmit data between external systems and computer systems 110 in fin modules 104.

Although in the embodiment shown in FIG. 1, data bus 127 and power bus 126 are in base module 102, in various embodiments, data and power or both for a fin module may be located outside of a base module. For example, in one embodiment, data may be provided by way of a data bus that runs along the top of system 100. The data bus may run, for example, in a tray along the top of frame 106. In certain embodiments, data connections for a fin module may include one or more weather-proof multi-pair fiber connectors, such as a 12-pair Corning OptiTap MT connector, either through a bus module or through a separate connector directly on a fin. Connections may be optical, conductive (such as copper), or a combination thereof.

Figure 2:
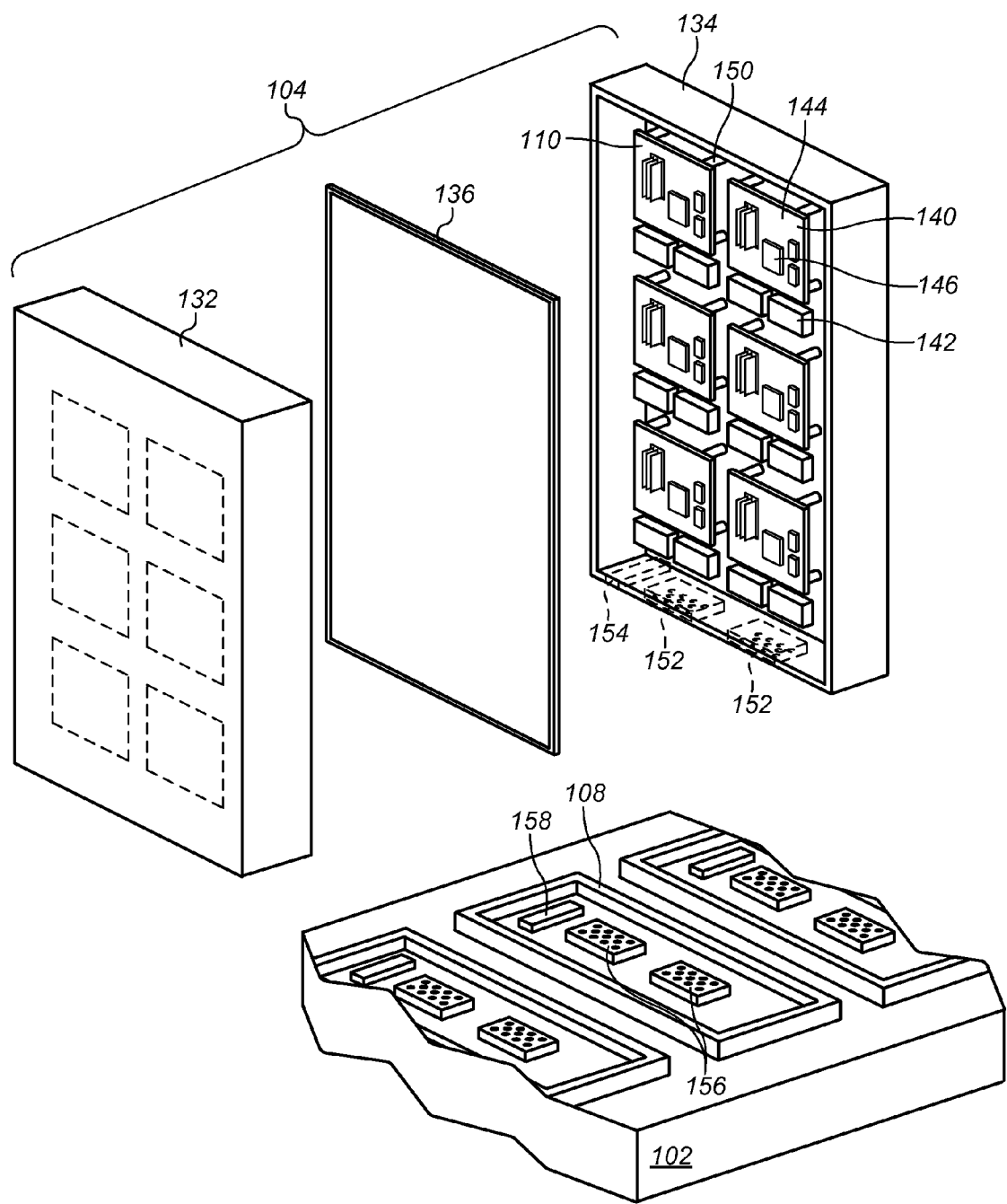
FIG. 2 is a partially exploded view illustrating one embodiment of a fin module and a receptacle for the fin module.

FIG. 2 is a partially exploded view illustrating one embodiment of a fin module and a receptacle for the fin module on a base module. Fin module 104 includes computer systems 110, left fin member 132, right fin member 134, and gasket 136. Computer systems 110 are coupled to each of left fin member 132 and right fin member 134. Left fin member 132 may couple with right fin member 134 to form an enclosure, for example, in a clamshell arrangement. Left fin member 132 and right fin member 134 may be coupled to another in any manner. In some embodiments, left fin member 132 and right fin member 134 are coupled with fasteners such as screws, bolts, hooks, or clips. Gasket 136 may provide an environmental seal at the junction between left fin member 132 and right fin member 134.

Each of computer systems 110 includes motherboard assembly 140 and mass storage devices 142. Mass storage devices 142 may, for example, hard disk drives or solid state drives. Each of motherboard assemblies 140 includes motherboard 144, central processing unit 146, and memory modules 148. Motherboard assembly 140 may couple to right fin member 134 on bosses 150. In some embodiments, bosses 150 are thermally conductive. Bosses 150 may draw heat away from motherboard assembly 140.

Left fin member 132 and right fin member 134 may be produced in any manner, including by casting, molding, or machining. In some embodiments, left fin member 132 and right fin member 134 may be formed from sheet metal. The chassis may be produced as a single part (one piece of sheet metal, for example), or it may be an assembly of parts. Fin members may be cast or milled with smaller surface fins for greater heat dissipation from the fin members to the surrounding air. In some embodiments, surface fins may be soldered, brazed, or bolted to the main body of a fin member. In certain embodiments, a fin may be contoured to match the locations of heat producing components. For example, in one embodiment, a fin may be stamped from sheet metal with contours that match the locations of heat producing components on a motherboard when the motherboard is coupled to the fin.

In the embodiment illustrated in FIG. 2, computer systems 110 and their associated motherboard assemblies 140 are arranged in a two by three array in a generally co-planar arrangement, on each of the left and right halves of the fin module. A fin module may, however, include any number of computer systems, in any arrangement. In various embodiments, computer systems may be arranged in a two by four arrangement, or a three by four arrangement, or a one by N arrangement. In certain embodiments, motherboard assemblies may be stacked on one another in a fin module.

Fin module 104 may couple in receptacle 108 of base module 102. In some embodiments, fin module 104 may be secured to base module 102, such as with screws, bolts, hooks, clips, or other fasteners. In certain embodiments, one or more of fin modules 104 of a system are secured at or near the top of fin modules 104 (for example, to the upper members of frame 106 shown in FIG. 1) for additional stability.

Fin module 104 includes power connector halves 152 and data connector half 154. Base module 102 includes power connector halves 156 and data connector half 158. As fin module 104 is installed in receptacle 108 of base module 102, power connector halves 152 on fin module 102 may couple with power connector halves 156 on base module 102, and data connector half 154 on fin module 104 may couple data connector half 158 on base module 102. In certain embodiments, a coupling mechanism is included on base module 102 and/or fin module 104 to apply a force to couple the mating connector halves with one another.

In the embodiment illustrated in FIG. 2, power and data connections are made with blind-mate connectors at the mounting location of fin module 104 on base module 102. In other embodiments, power and/or data connections between a fin module and other elements may be made at another location. For example, receptacle for cable connections may be provided on one or more sides of left fin member 132 or right fin member 134, such as through environmentally sealed connectors. In some embodiments, power and/or data connectors may be positive-lock connectors.

In some embodiments, a fin module includes power conversion module, for example, to convert 480V power to a lower AC or to DC voltages. In some embodiments, a fin module may include a network routing module and/or switching module. Such modules may be provided on a dedicated circuit board assembly or included on a circuit board with other functions, such as motherboard 144.

Figure 3:
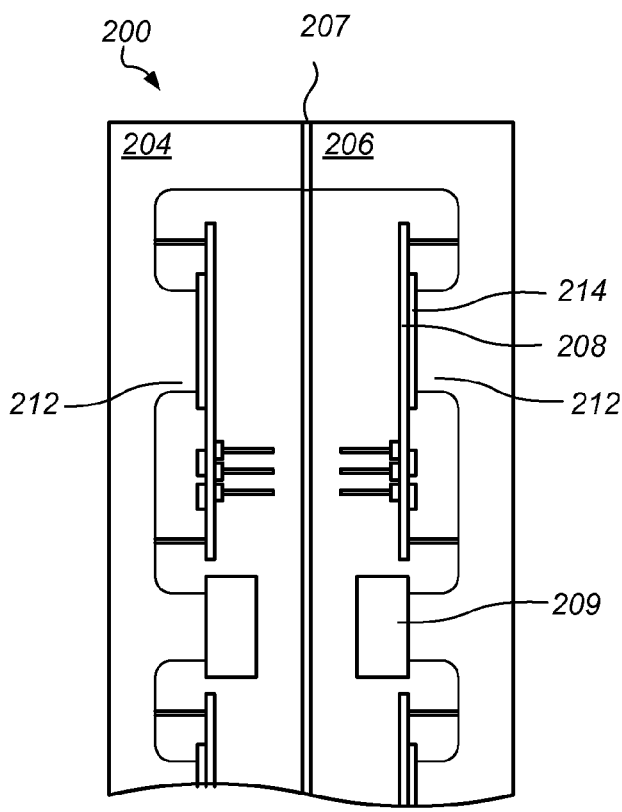
FIG. 3 illustrates a cross sectional side view of a fin module including motherboard assemblies on left and right sides of a clamshell enclosure according to one embodiment.

FIG. 3 illustrates a cross sectional side view of a fin module including motherboard assemblies on left and right sides of a clamshell enclosure according to one embodiment. Fin module 200 includes left fin member 204 and right fin member 206. Left fin member 204 may couple with right fin member 206 to form an enclosure in a clamshell arrangement, similar to that described above relative to FIG. 2. Gasket 207 may be provided between left fin member 204 and right fin member 206. Motherboard assemblies 208 may be mounted to left fin member 204 and right fin member 206 on stand-offs 210. Mass storage devices 209 may be mounted on left fin member 204 and right fin member 206. Left fin member 204 and right fin member 206 include heat spreading protrusions 212. Left fin member 204 and right fin member 206 may be produced such that the heat spreading protrusions conform to and/or correspond to selected heat producing components on motherboard assemblies 208. For example, as illustrated in FIG. 3, one of heat spreading protrusions 212 may extend to contact central processing unit 214. Heat spreading protrusions 212 may remove heat produced during operation of central processing unit 214 and reject the heat from fin module 200 to ambient air.

Figure 4:
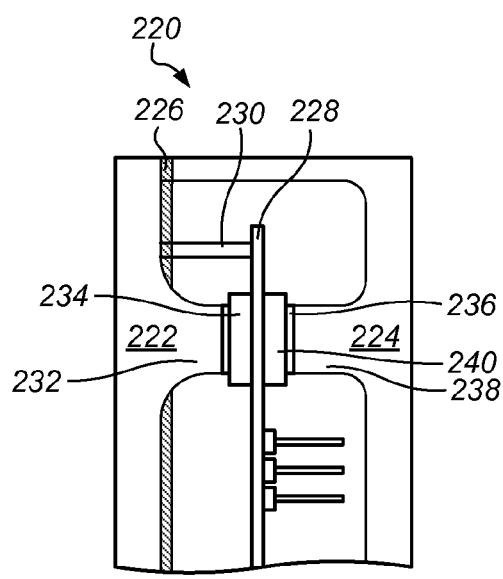
FIG. 4 illustrates a cross sectional side view of a fin module including a single row of motherboard assemblies in an enclosure according to one embodiment.

In some embodiments, board mounting systems for a fin module account for thermal expansion characteristics of the fins and/or manufacturing tolerances in the fin members and other elements. FIG. 4 illustrates a cross sectional side view of a fin module including a single row of motherboard assemblies in an enclosure according to one embodiment. Fin module 220 includes left fin member 222 and right fin member 224. Gasket 226 is provided between left fin member 222 and right fin member 224. Motherboard 228 is mounted to left fin member 222 on stand-offs 230. Motherboard assemblies for one or more additional computer systems may be coupled to left fin member 222. In some embodiments, the additional motherboard assemblies are in a common plane with motherboard assembly 228, so as to form a row or array of motherboard assemblies 228. Heat spreading protrusion 232 on left fin member 222 may extend to heat producing component 234.

Thermal interface pad 236 may be provided on heat spreading protrusion 238 of right fin member 224. When right fin member 224 is coupled to left fin member 236, thermal interface pad 236 may be compressed between heat producing component 240 on motherboard assembly 228 and heat spreading protrusion 238 of right fin member 224. Thermal interface pad 236 may be made of a resilient material. Compression of thermal interface pad 236 may establish low thermal resistance between heat producing component 240 and heat spreading protrusion 238, thereby facilitating removal of heat from heat producing component 240.

Figure 5:
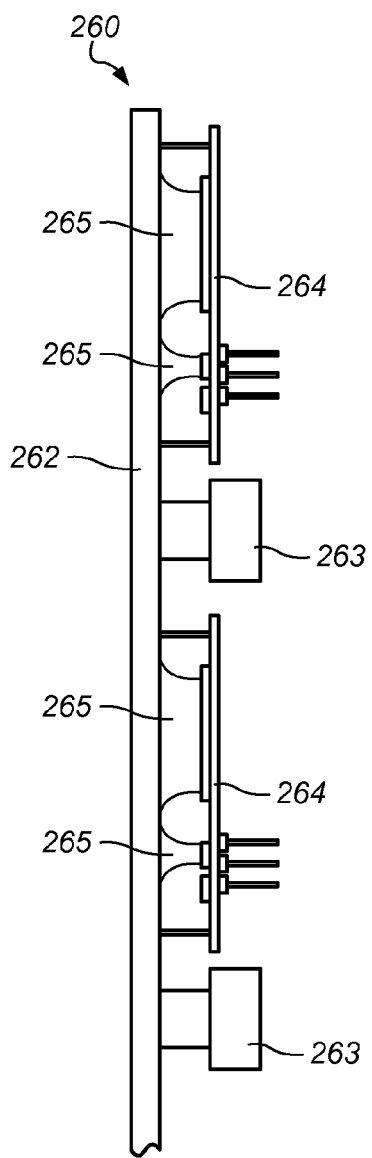
FIG. 5 illustrates a cross sectional side view of an embodiment of a fin module that includes a motherboard mounted on one side of a fin.

FIG. 5 illustrates a cross sectional side view of an embodiment of a fin module that includes a motherboard mounted on one side of a fin. Fin module 260 includes fin 262. Motherboard assemblies 264 are coupled to fin 262. Fin module 260 may be coupled to a base module, such as base module 102 described above relative to FIG. 1.

In some embodiments, particular fin modules may have dedicated, specialized functions within the system. For example, in the embodiment illustrated in FIG. 1, every fifth fin module in each row may be a network module, or every fourth fin module in each row may be a switch module. The specialized function fin modules may provide services to the fin modules near the specialized module.

In some embodiments, a computing unit including a base module and installed fin modules a may be certified as a unit. In some embodiments, each module, prior to shipment to the site, may be pre-certified by a Nationally Recognized Testing Laboratory. In certain embodiments, a computing unit may be UL-listed and/or ETL-listed. A computing unit, or portions a computing unit, may be ETL SEMKO, CE/ETSI, or UL stamped. In some embodiments, having a certified unit will reduce the scope of an inspection for a data center or for a building housing a data center.

Figure 6:
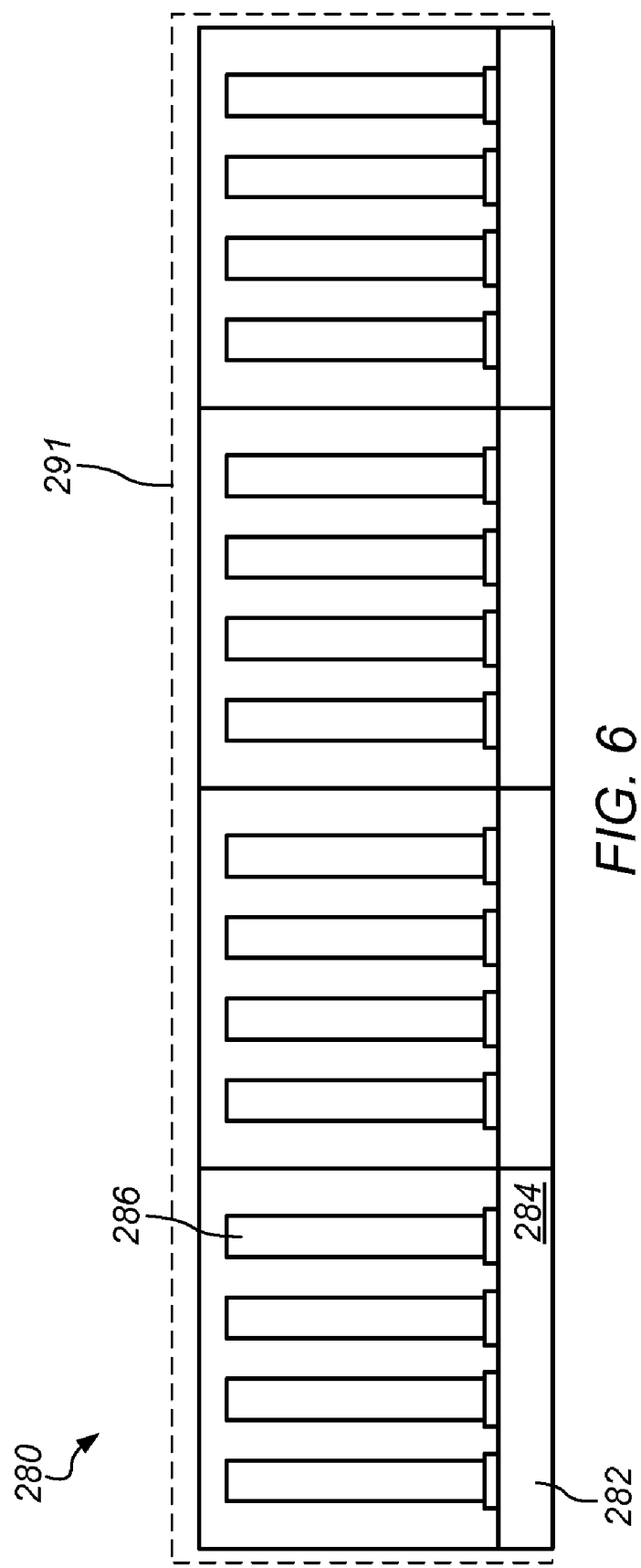
FIG. 6 is a schematic diagram illustrating an embodiment of a system having four computing modules that can be coupled together end-to-end to form a standard size unit for shipping.

In some embodiments, two or more modules may be coupled to form a unit that is in accordance with an in accordance with a standard unit for containerized shipping. FIG. 6 is a schematic diagram illustrating an embodiment of a system having four computing modules that can be coupled together end-to-end to form a standard size unit. System 280 includes computing modules 282. Each of computing modules 282 includes base module 284, fin modules 286, and frame 288. Fin modules 286 may be mounted on base module 284. Base module 284 may provide electrical power and/or data to fin modules 286. Base modules 284 may include power buses and data buses similar to those described above relative to FIG. 1. When coupled together, the combined four computing modules 282 may have a form that is in accordance with a standard for container shipping. In one embodiment, computing modules 282 combine to form a unit that has a form in accordance with a Twenty foot Equivalent Unit ("TEU") (such as within envelope 291 shown in FIG. 6).

In some embodiments, some or all of computing modules may physically couple to one another. In certain embodiments, computing modules may be fastened together, such as by bolts or pins. In other embodiments, however, computing modules may not be fastened together, but simply be positioned next to one another. In some embodiments, adjoining modules may include aligning elements such as rails, pins, or keys. In certain embodiments, one or both of two adjoining computing modules, may include seal elements such that a seal is automatically made between the adjoining elements when they are coupled to one another (such as between adjacent base modules).

In certain embodiments, modules of a modular computing system may be spaced from one another. Connections between modules may be made with suitable ducts, conduits, electrical cables, buses, etc.

In the embodiments illustrated in FIG. 6, computing modules 282 are positioned in line with one another. In other embodiments, however, computing modules may have different forms, and be arranged in different ways, for example, in a two by two array of computing modules.

Figure 7:
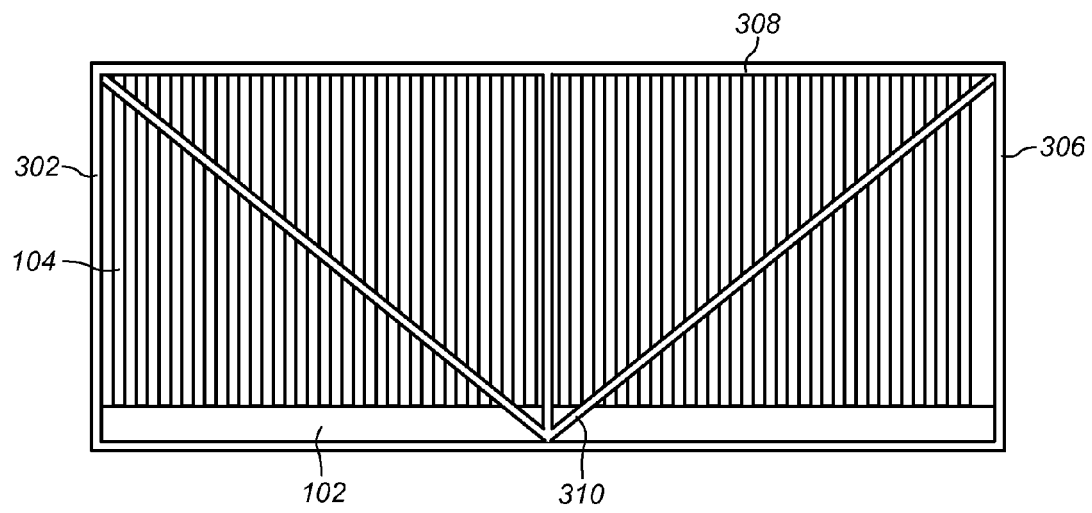
FIG. 7 illustrates an embodiment of a system having a box frame that contains a base module and fin modules.
Figure 8:
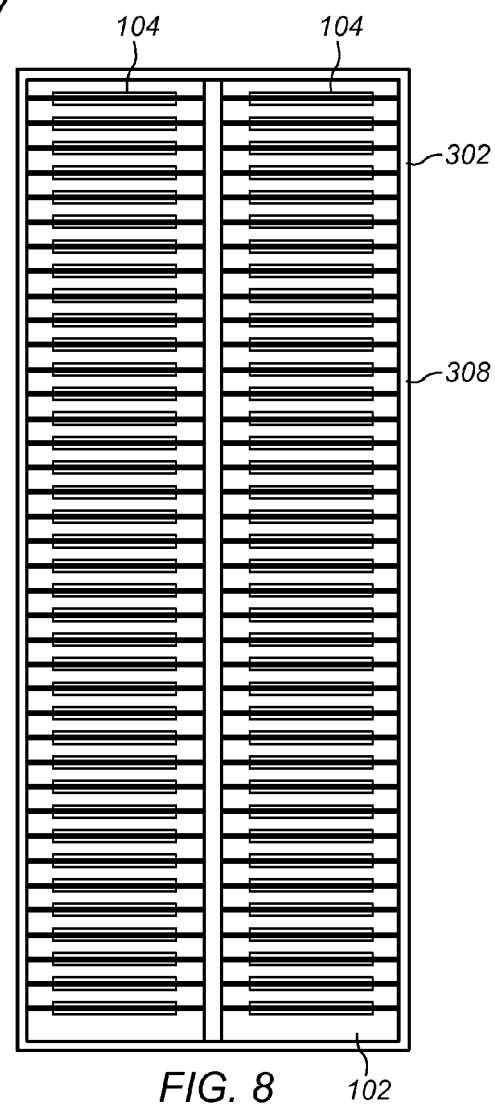
FIG. 8 illustrates a top view of a system having a box frame that contains a base module and fin modules.
Figure 9:
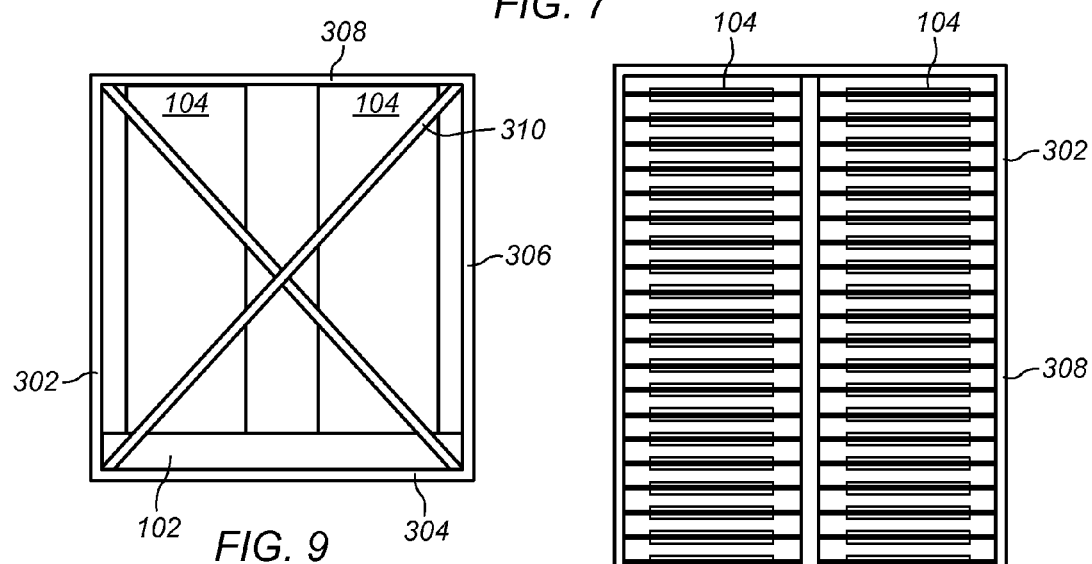
FIG. 9 illustrates an end view of a system having a box frame that contains a base module and fin modules.

FIG. 7 illustrates an embodiment of a system having a box frame that contains a base module and fin modules. FIG. 8 illustrates a top view of the system shown in FIG. 7. FIG. 9 illustrates an end view of the system shown in FIG. 7. System 300 includes base module 102, fin modules 104, and box frame 302. Base module 102 and fin modules 104 may be similar to those described above relative to FIG. 1. In some embodiments, system 300 may have a form in accordance with a Twenty foot Equivalent Unit standard.

Box frame 302 includes bottom members 304, posts 306, top members 308, and cross members 310. Base module 102 may be supported on bottom members 304. Cross members 310 may provide structural reinforcement to frame 302, for example, during transport of system 300. In some embodiments, system 300 may include exterior panels over any or all of the sides of the box frame (panels are not shown in FIGS. 7-9 for illustrative purposes). In some embodiments, exterior panels may provide environmental protection to base module 102 and/or fin modules 104 during shipping of system 300. The exterior panels may be removed when system 300 is placed into operation.

In various embodiments, heat may be rejected from heat producing components into fins of fin modules. Fins may carry the heat from the heat producing components to the external surfaces of the fins. In some embodiments, heat may be removed from fin modules without any forced air cooling. Heat may be transferred from fins of a fin module by natural convection and radiation, for example. Removing heat through fins and rejecting the heat to ambient air may eliminate a need for air handling systems, chilled water systems, and/or HVAC systems, thereby reducing the cost and complexity of a system. In certain embodiments, however, a system may provide for forced air cooling of fin modules.

Figure 10:
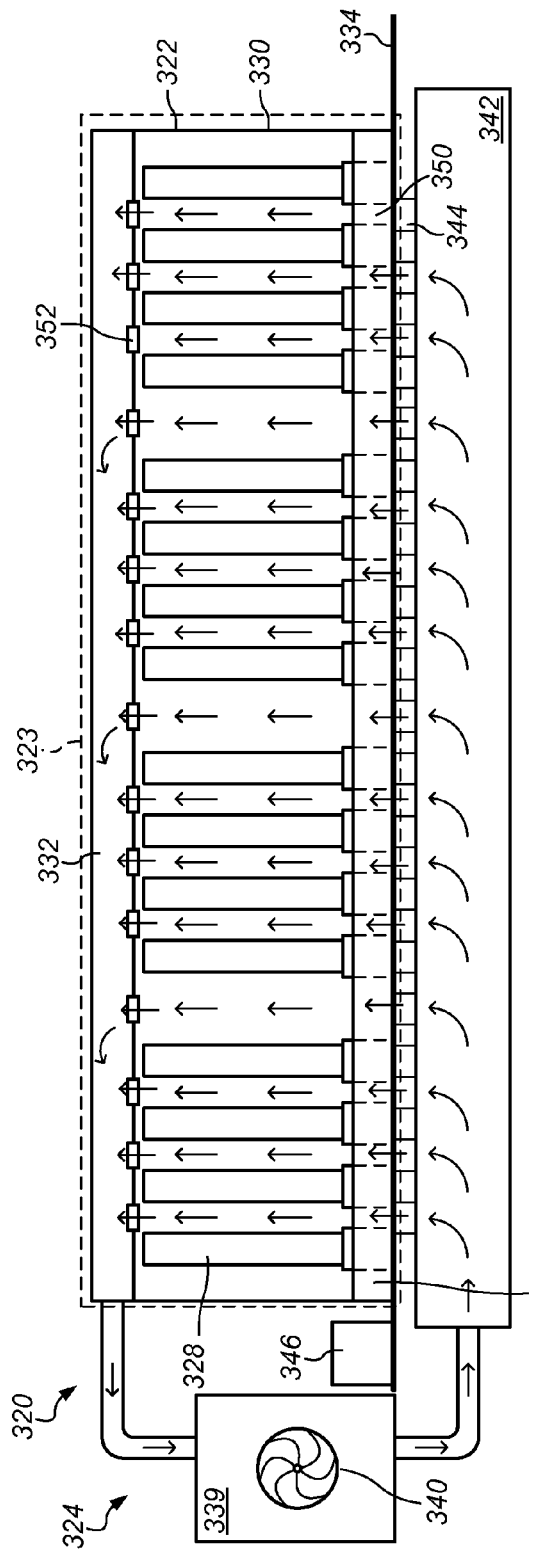
FIG. 10 illustrates one embodiment of an air handling system that moves air between fin modules of a computing unit.

FIG. 10 illustrates one embodiment of an air handling system that moves air between fin modules of a computing unit. System 320 includes computing unit 322 and air handling system 324. Computing unit 322 includes base module 326, fin modules 328, frame 330, and plenum 332. Computing unit 322 may rest on raised floor 334. Computing unit 322 may be within TEU envelope 323.

Air handling system 324 includes blower system 339, blower 340, sub-floor chamber 342, raised floor vents 344, and control system 346. Control system 346 may be used to operate blower system 339 to pressurize sub-floor chamber 342 relative to the ambient air pressure in computing module 322. Air may pass from sub-floor chamber 342 through raised floor vents 344 and ducts 350 in base module 326, and pass in the spaces between fin modules 328. Heat from fin modules 328 may be rejected into the air passing upwardly over the fin modules. The air may pass through plenum vents 352 and into plenum 332. Air from plenum 332 may be returned to blower system 339, rejected to outside air, or a combination of both. In certain embodiments, plenum 332 may be omitted and air pass rise from between fin modules 328 and dissipate (for example, into an outdoor environment.

Figure 11:
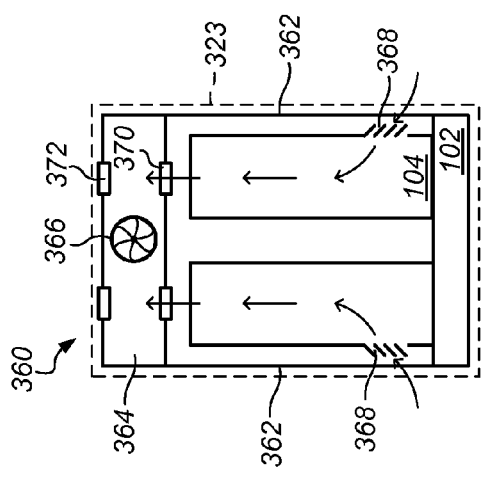
FIG. 11 illustrates an embodiment of a computing unit that includes an on-board fan for moving air across fin modules in the computing unit.

FIG. 11 illustrates an embodiment of a computing unit that includes an on-board fan for moving air across fin modules in the computing unit. Computing unit 360 includes base module 102, fin modules 104, side panels 362, plenum 364, and fan 366. Computing unit 322 may be within TEU envelope 323. Side panels 362 include louvers 368. Fan 366 may be operated to draw air into computing module 360 through louvers 368. Air may pass over fin modules 104, removing heat from the fin modules. Air may pass upwardly through vents 370 and into plenum 364. Air may be discharged from plenum 364 through vents 372.

In certain embodiments, a system may move air through an enclosure of a fin module to cool computer systems of the fin module. For example, in certain embodiments, inlet and outlet vents may be included in left fin member 132 and/or right fin member 134 shown in FIG. 2. The vents may allow air to pass through the interior of the enclosure to cool heat producing components in fin module 104.

In certain embodiments, cooling components of an air handling sub-system may be coupled to a control system. The control system may measure conditions such as temperature, pressure, flow rate, and humidity for the system and adjust cooling system parameters for that the system, such as fan speed, air source, mechanical cooling based on the measured conditions. Devices in air handling sub-systems may be controlled automatically, manually, or a combination thereof.

In certain embodiments, a control system for cooling a system includes at least one programmable logic controller. The PLC may, among other things, open and close dampers in air handling systems based upon command signals from an operator to channel air flow through a data center module as necessary for the prevailing operational conditions. Alternatively, the PLC may modulate dampers between fully open and fully closed positions to modulate airflow.

In various embodiments, operation of one or more air handling sub-system of a cooling system may be controlled in response to one or more conditions. For example, the controller may be programmed to switch the air source for an air-handling sub-system from return air to outside air when one or more predetermined conditions are met, such as temperature and humidity.

Figure 12:
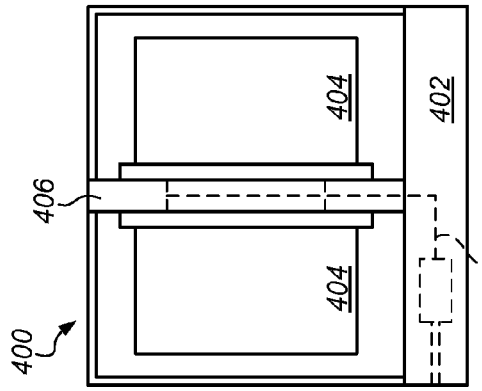
FIG. 12 illustrates an embodiment of a computing unit with fan modules mounted to a base module having a central spine.

FIG. 12 illustrates an embodiment of a computing unit with fan modules mounted to a base module having a central spine. Computing unit 400 includes base module 402 and fin modules 404. Base module 402 includes central spine 406. Power distribution system 408 may be routed through base module 402 to provide power to fin modules 404.

In some embodiments, a computing unit includes attach points to facilitate positioning of the computing unit. A gantry crane may be used, for example, to move units from a loading area to an open operational position or vice versa, which may allow for denser packing of units within a data center.

Figure 13:
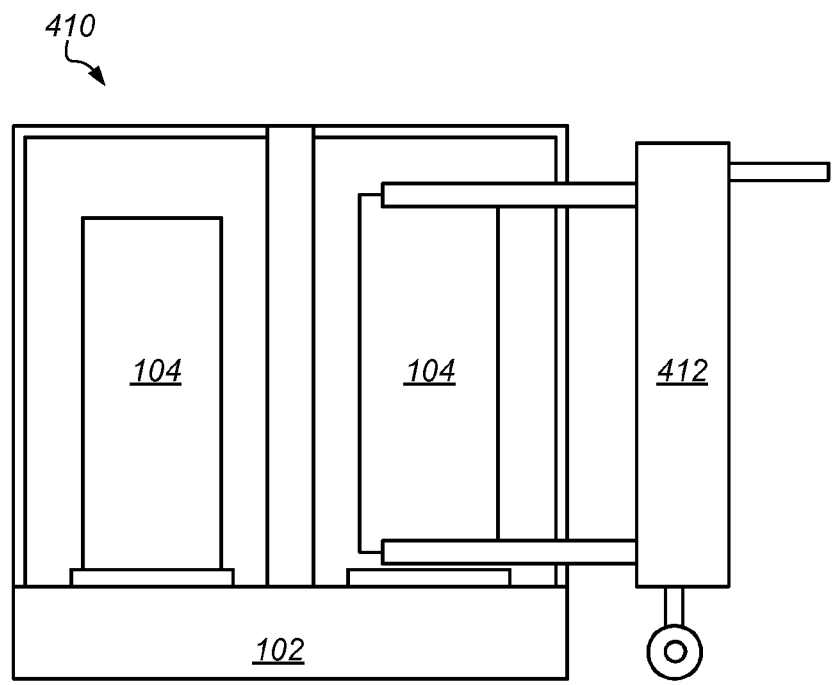
FIG. 13 illustrates one embodiment of removal of a fin module from a computing unit.

In some embodiments, fin modules may be individually removable from a computing unit. FIG. 13 illustrates one embodiment of removal of a fin module from a computing unit. Computing unit 410 includes base module 102 and fin modules 104. Base module 102 and fin modules 104 may be similar to those described above relative to FIG. 1. Installation/removal device 412 may be used to remove or install fin modules from base module 102. In some embodiments, installation/removal device 412 may include a dolly to assist in moving fin modules 102.

In some embodiments, a computing unit including a base module and fin modules may operate in an outdoor environment. The base module and fin modules may be in separate enclosures that are suitable for exposure to an outside environment. In some embodiments, elements of a fin module and/or base module are contained in a sealed enclosure. In certain embodiments, base modules and fin modules of a computing unit may be weather-sealed and nitrogen purged for operation outdoors. For example, the interior of fin module 104 shown in FIG. 2 may be purged with nitrogen and sealed prior to being placed into operation. Materials may be selected to withstand environmental conditions for the design lifetime of the unit. Adequate access for container handling equipment may be provided around the unit.

Figure 14:
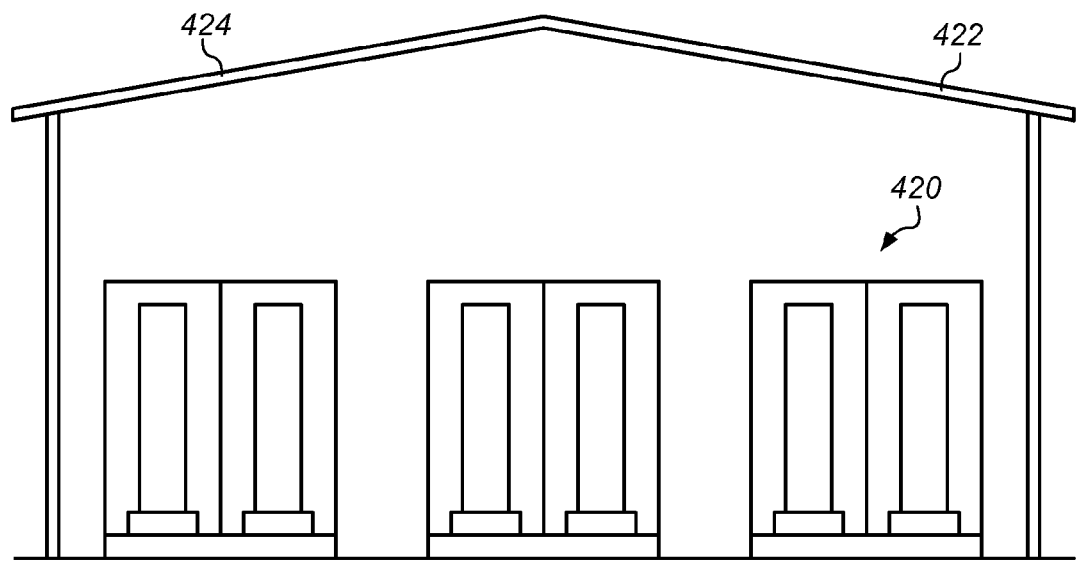
FIG. 14 illustrates one embodiment of computing units in a shelter.

In some embodiments, computing units may be operated in a limited shelter and/or partially protected environment. For example, a computing unit may be operated within a pole barn or other simple structure to limit exposure to precipitation and provide an additional layer of access control. In some embodiments, fans may be included in a shelter to provide positive pressure in one or more areas of the building and negative pressure in others might be needed to ensure adequate airflow. FIG. 14 illustrates one embodiment of computing units in a shelter. Computing units 420 are positioned on the floor of pole barn 422. Pole barn 422 includes roof 424. Pole barn 422 may provide partial protection for computing units 420 during operation of the computing units. For example, pole barn 422 may keep rain out of fin modules and/or base modules of computing units 420. In some embodiments, fin modules and/or base modules of computing units 420 may include further environmental protection, such as an enclosure (sealed or unsealed), to protect against condensation, etc., in computer systems of a fin module.

Figures 15, 16:
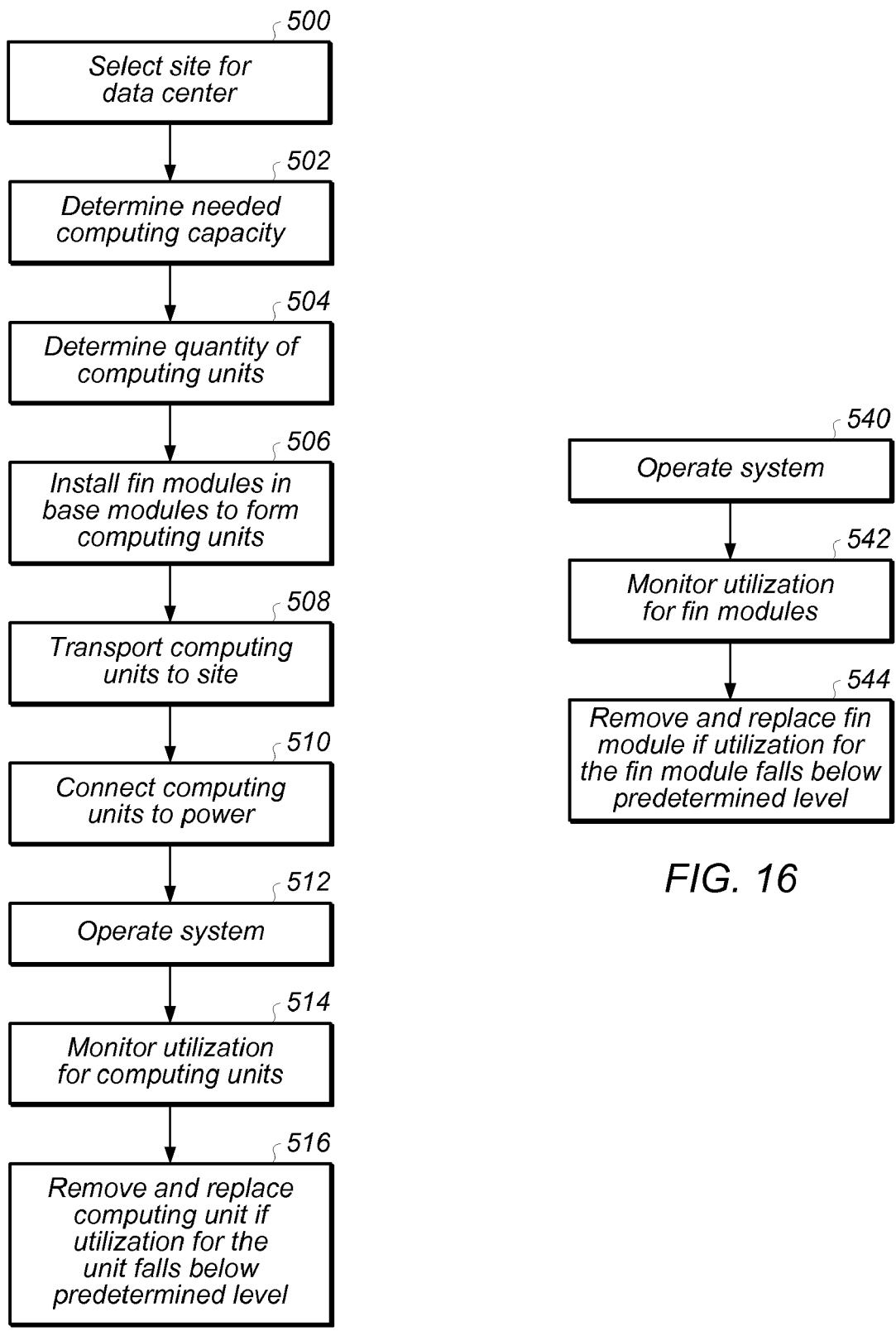
FIG. 15 illustrates one embodiment of providing computer resources using computing units having fin modules.
FIG. 16 illustrates a removal and replacement of individual fin modules to maintain a desired minimum available capacity level in a data center.

FIG. 15 illustrates one embodiment of providing computer resources using computing units having fin modules. At 500, a site for providing computing resources with computing units, such as system 100 described above relative to FIG. 1, is selected. In some embodiments, the site is an outdoor location. In other embodiments, the site is an indoor location, such as inside a warehouse. In some embodiments, the site is an outdoor location including a shelter, such as a pole barn.

At 502, computing capacity needed for a data center is determined. At 504, a quantity of computing units for a computing system is determined from the required computing capacity.

At 506, fin modules are installed on a base module to form a computing unit. The number of fin modules installed may, in various embodiments, depend on the amount of capacity required for a data center. In some embodiments, the computing units may be pre-assembled, off-the-shelf units. In some embodiments, computing units, or portions of computing units, are pre-fabricated at one location, such as a factory, and transported to a data center site at another location. In certain embodiments, however, all or some portions of the computing units for a data center may be assembled at the data center site.

At 508, computing units are shipped to the site. In some embodiments, each computing unit is transported as a TEU. In some embodiments, two or more computing units may be coupled together to form a TEU. The modules may be shipped as a combined unit. Alternatively, each of the computing modules may be shipped separately.

At 510, computing units may be connected to electrical power in the data center. In some embodiments, electrical power may be provided through external power cables connected to a power distribution system in a base module of a computing unit.

At 512, the modular computing system may be operated to provide computing services for a data center. In some embodiments, one or more of the fin modules may serve as seeds. The seed or seeds may allow for initial bootstrapping via a local storage device (such as a USB flash drive). Alternatively, a seed fin module could contain at least one pre-loaded OS image capable of fetching, decrypting, and executing an encrypted bootstrapping image over a multi-hop IP network—for example, from S3. All systems in each fin may be capable of network booting for initial provisioning. Remotely-operated power switches may be provided on the base module to energize or deenergize individual fin modules, or individual motherboards within each fin module.

At 514, a level of available capacity may be monitored for the computing units. Available capacity may be based on the quantity of resources available as the as a percentage of the total capacity for a system. For example, in the context of a computing unit, available capacity may be the number of servers actually available to perform computing operations as a percentage of the total capacity for servers in the computing unit. For example, if a computing unit holds 120 servers, but there are servers operating in only 90 of the slots in the computing unit, then available capacity for the computing unit may be 75%. As another example, if a fin module carries 6 servers, but only two of the servers are operating, then available capacity for the fin module may be 33%. In certain embodiments, a system may be monitored in other manners, such as the percentage of the total computing capacity that is actually being used.

At 516, if available capacity for the computing unit falls below a predetermined level, the computing unit may be taken off-line, removed and replaced. For example, the computing unit may be taken off-line, removed and replaced if available capacity drops below 70%. In some embodiments, the unit replaced may be a TEU. In some embodiments, all maintenance on a computing unit is performed at depot level (for example, performed at a depot facility and not at the data center). In some embodiments, each fin module is a field replaceable unit. In some embodiments, components inside a fin module (such as computer systems 110 in fin module 104 described above relative to FIG. 2), may be inaccessible to field maintenance personnel.

In some embodiments, components in a fin module, such as computer systems 110, may be inaccessible in order to maintain the components in a sealed environment. A sealed environment may, for example, allow the systems to be operated in an outdoor and/or limited shelter environment.

In some embodiments, all of the components in a computing unit (such as the entirety of components in system 100 described above relative to FIG. 1) may be inaccessible to field maintenance personnel.

In embodiments in which the computing module physically coupled to other modules (for example, as part of a TEU), the computing module to be replaced may be separated from other units in the data center.

FIG. 16 illustrates a removal and replacement of individual fin module units to maintain a desired minimum available capacity level. At 540, the system is operated to perform computing operations. At 542, a level of available capacity may be monitored for one or more of the fin modules. At 544, if available capacity for an individual fin module falls below a predetermined level, the individual fin module may be taken off-line, removed and replaced.

In another embodiment, one or more fin modules may be replaced or added to a computing unit if available capacity for the computing unit falls below a predetermined level. For example, if available capacity in a computing unit falls below 70%, the fin modules at the lowest level of available capacity (for example, having multiple server positions that have failed) may be replaced by fin modules that have a higher level of available capacity, and/or fin modules may be installed in empty slots on the computing unit.

Although in the embodiments shown in FIG. 1, the base module is located below the fin modules that are mounted to it, a base module may be in any position relative to the fin modules. In addition, fin modules may extend in any direction from a base module. For example, as is illustrated in FIG. 12, fin modules may extend laterally from a central spine of a base module.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for providing computing capacity, comprising:
a base module comprising an electrical power bus; and
two or more fin modules coupled to the base module, wherein at least one of the fin modules comprises one or more fins and two or more computer systems coupled to at least one of the fins, wherein at least one of the fins to which the two or more computer systems are coupled is configured to extend from the base module such that the fin has a primarily vertical orientation,
wherein the electrical power bus is configured to supply power to at least one computer system of at least one of the fin modules.

2. The system of claim 1, wherein the at least one fin module comprising the two or more computer systems is configured to be a field replaceable unit.

3. The system of claim 2, wherein the at least one fin module comprising the two or more computer systems comprises an enclosure that houses the two or more computer systems such that the two or more computer systems in the enclosure are inaccessible to field service personnel.

4. The system of claim 1, wherein at least one of the fins of at least one of the fin modules is configured to conduct heat away from at least one computer system coupled to the fin.

5. The system of claim 1, wherein at least one of the fins of at least one of the fin modules is coupled to the base module in a substantially vertical orientation.

6. The system of claim 1, wherein the base module comprises a spine, wherein at least one of the fins of at least one of the fin modules extends at least partially laterally from the spine of the base module.

7. The system of claim 1, wherein at least one of the fin modules is a special function module.

8. The system of claim 1, wherein at least one of fin modules is configured to serve as a seed for initializing operation of computer systems in two or more of the fin modules of the system.

9. The system of claim 1, wherein each of at least two of the computer systems each comprise a motherboard, wherein at least two of the motherboards for the computer systems are spaced apart from one another on one side of one of the fins of the fin module.

10. The system of claim 1, wherein the base module comprises a data bus, wherein in the data bus is configured to transfer data between at least one of the fin modules and at least one other fin module or at least one component external to the system.

11. The system of claim 1, further comprising one or more fans configured to move air over at least one fin on at least one of the fin modules.

12. The system of claim 1, wherein the base module and the fin modules are in a form in accordance with at least one standard for shipping containers.

13. The system of claim 1, further comprising at least one additional base module and at least one additional fin module coupled to the at least one additional base module, wherein the base module and the at least one additional base module are configured to couple with one another.

14. The system of claim 1, further comprising at least one additional base module and at least one additional fin module coupled to the at least one additional base module, wherein the base module and the at least one additional base module are configured to couple with one another such that the combined modules have a form in accordance with at least one standard for shipping containers.

15. The system of claim 1, further comprising at least one frame around at least a portion of the fin modules.

16. The system of claim 15, wherein the frame is configured to allow one or more of the fin modules to be removed from the base module as a field replaceable unit.

17. The system of claim 1, further comprising at least one fin module installer/extraction device configured to remove at least one of the fin modules from the base module.

18. A system for providing computing capacity, comprising:
a base module; and
two or more fin modules coupled to the base module, wherein at least one of the fin modules comprises one or more fins and two or more computer systems coupled to at least one of the fins, wherein at least one of the fins to which the two or more computer systems are coupled is configured to extend from the base module such that the fin has a primarily vertical orientation,
wherein the at least one fin module comprising the two or more computer systems is configured to be a field replaceable unit.

19. The system of claim 18, wherein one or more fins of at least one of the fin modules form at least a partial enclosure for at least one of the computer systems.

20. The system of claim 19, wherein at least one of the fin modules comprises a first fin member and a second fin member, wherein the at least one of the computer systems is between the first fin member and the second fin member, wherein the first fin member and the second fin member combine to at least partially enclose the at least one computer system.

21. A method of providing computing capacity, comprising:
installing two or more fin modules on a base module to form a unit, wherein the fin modules are configured to extend from the base module such that at least one of the fin modules has a primarily vertical orientation, wherein at least one of the fin modules comprises two or more computer systems;

transporting the unit, with the fin modules installed on the base module, to a data center;

placing the unit at a location at a data center; and operating at least one of the computer systems to perform computing operations at the data center.

22. The method of claim 21, wherein the unit has a form in accordance with at least one standard for shipping containers.

23. The method of claim 21, further comprising:

coupling at least one fin module to the at least one additional base module to form an additional unit; and coupling at least one additional base module to the base module to form a combined unit.

24. The method of claim 23, wherein the combined unit is in accordance with a standard for shipping containers, wherein transporting unit comprises transporting the combined unit to the data center, the method further comprising decoupling the at least one additional unit from the unit at the data center before placing the unit or the additional unit into operation at the data center.

25. The method of claim 21, further comprising supplying power to at least one the computer systems in at least one of the fin modules through the base module.

26. The method of claim 21, further comprising:

monitoring a level of available capacity in the computer systems for one or more of the fin modules; and removing and replacing a fin module when the level of available capacity for the fin module drops below a predetermined level.

27. The method of claim 21, further comprising:

monitoring a level of available capacity in the computer systems in the unit; and removing and replacing the unit when the level of available capacity for the unit drops below a predetermined level.

28. The method of claim 21, wherein at least one fin of at least one of the fin modules is configured to draw heat away from one or more heat producing components in at least one of the computer systems, the method further comprising forcing air across the at least one fin to remove heat from the at least one fin.

* * * * *